(12) United States Patent
Lu et al.

(10) Patent No.: US 9,814,143 B1
(45) Date of Patent: Nov. 7, 2017

(54) METHOD OF FORMING PATTERN WITH HIGH ASPECT RATIO ON POLYCRYSTALLINE ALUMINUM NITRIDE SUBSTRATE

(71) Applicant: NATIONAL CHUNG SHAN INSTITUTE OF SCIENCE AND TECHNOLOGY, Taoyuan (TW)

(72) Inventors: Chung-Yen Lu, Taoyuan (TW); Yi-Hsiuan Yu, Tao-Yuan (TW); Chia-Ting Lin, Hsinchu County (TW); Lea-Hwung Leu, Taoyuan (TW)

(73) Assignee: National Chung Shan Institute of Science and Technology, Toayuan (TW)

( * ) Notice: Subject to any disclaimer, the term of this patent is extended or adjusted under 35 U.S.C. 154(b) by 0 days.

(21) Appl. No.: 15/362,105

(22) Filed: Nov. 28, 2016

(51) Int. Cl.
*H01L 21/00* (2006.01)
*H05K 3/00* (2006.01)
*H01L 21/48* (2006.01)
*H01L 23/498* (2006.01)

(52) U.S. Cl.
CPC ......... *H05K 3/0041* (2013.01); *H01L 21/486* (2013.01); *H01L 23/49833* (2013.01); *H01L 23/49838* (2013.01)

(58) Field of Classification Search
None
See application file for complete search history.

(56) References Cited

U.S. PATENT DOCUMENTS

2009/0104738 A1* 4/2009 Ring ............... H01L 21/76898
438/172
2015/0235856 A1* 8/2015 Hwang ............ H01L 21/28587
257/472

* cited by examiner

*Primary Examiner* — Bradley K Smith
(74) *Attorney, Agent, or Firm* — WPAT, P.C.; Anthony King

(57) ABSTRACT

A method of forming a pattern with high aspect ratio on a polycrystalline aluminum nitride substrate comprises the steps of (A) providing an aluminum nitride substrate and forming a barrier layer on the aluminum nitride substrate; (B) etching the barrier layer with an energy beam to form at least one recess in the barrier layer; (C) plasma etching the substrate to deepen the recess into the aluminum nitride substrate; (D) removing the barrier layer to obtain the aluminum nitride substrate having at least one pattern with high aspect ratio. The method uses the energy beam to directly form a pattern on the barrier layer, and further employs plasma etching to prepare the aluminum nitride substrate having a pattern with high aspect ratio quickly and effectively.

10 Claims, 6 Drawing Sheets

METHOD OF FORMING PATTERN WITH HIGH ASPECT RATIO ON POLYCRYSTALLINE ALUMINUM NITRIDE SUBSTRATE

FIELD OF THE INVENTION

The present invention relates to a method of forming a pattern on the polycrystalline aluminum nitride substrate and, more particularly, to a method of forming a pattern with high aspect ratio on the polycrystalline aluminum nitride substrate.

BACKGROUND OF THE INVENTION

3D IC (three-dimensional integrated circuit) technology is a processing technique to perform three-dimensional spatial stacking of the multi-layered IC. Compared to traditional 2D IC, 3D IC allows more elements being positioned more adjacent to one another on the chip, so that the distance among the signal lines of the elements can be significantly decreased, which further improves the lag effect of signal transmission and power consumption. Generally, 3D IC process adopts TSV (Through Silicon Via) which includes the steps of forming holes on the wafer, then filling a conductive material (such as copper, polycrystalline silicon, and tungsten) into the holes to form conductive channels, and finally thinning the wafer or dies and stacking and joining the same for forming the 3D IC chip.

In addition to producing TSV within the dies for connecting the dies of different functions, a technique which uses interposer along with TSV technology to join different chips for forming the 3D IC is also provided. Nowadays, development of 3D IC interposer technology principally focuses on the silicon and glass substrates. The silicon substrate has good thermal conductance (K: ~140 W/mK), and when it is used as the interposer of the multi-chip stack in the 3D IC process, the possibility that the elements fail due to heat accumulation under high-power operation can be lowered. However, since the energy band gap of the silicon substrate (1.1 eV/300 K) is not large, there is a concern of electrical leakage if the silicon substrates are applied for the electrical elements of thinned chip stack with higher voltage. To solve this problem, a technique of forming an oxide layer on the silicon substrate is developed in order to enhance the effect of insulation. Although this technique can improve electrical leakage of the interposer, heat dissipating ability of the elements is lowered and the manufacturing cost is raised. To enhance competitive capability of the product by lowering the manufacturing cost of the interposer, a lot of manufacturers start to use glass (silicon dioxide) substrates as the interposer substrate. Although the glass substrate interposer has preferable insulation, is not expensive, and is much more available and currently becomes one of the materials of the interposer developed by the manufactures, for the applications in relevant products with miniaturized, multi-functional, and high efficient demands, the glass substrate interposer has low thermal conductance (K: ~1.5 W/mK), and thus the chip modules have poor heat dissipating effect, easily resulting in gradual accumulation of heat source at the interface of the multi-layered stack of the chips and causing thermal failure of the elements. Therefore, the glass substrates are only suitable for the application of the products with lower power in the 3D IC process.

To solve the problem of electrical leakage and heat dissipation of the interposer, polycrystalline aluminum nitride substrates with low cost are now aggressively developed. Since aluminum nitride has good thermal conductance (K: 170~320 W/mK) and larger energy band gap (energy band gap: 6.015 eV), it can provide better thermal conductivity and insulation. Besides, since aluminum nitride has higher dielectric coefficient, the caused dielectric loss will be comparatively low, and thus the cross-talk effect between the electrically conductive lines can be mitigated.

Currently, the TSV process for the interposer is mainly to include the steps of defining the positions of the vias by the lithography technique, using the cured photoresist film or the metal coating layer as the etching barrier layer, and performing dry etching to form the vias. However, polycrystalline aluminum nitride is a material of ceramics with 11.5 eV of Al—N bonding energy. Thus, the etching rate of polycrystalline aluminum nitride substrate is much lower than that of the currently used silicon substrate, and it is required to strengthen conditions of the etching process and increase the thickness of the barrier layer to achieve the desired etching depth. With regard to the lithography process, resolution of the currently used dry type photoresist is insufficient, and the wet type photoresist, in order to form the small-sized pattern, would lead to the result that the thickness of the photoresist is too thin to deposit the etching barrier layer with sufficient thickness. Moreover, since the selectivity of the barrier layer to the aluminum nitride substrate is not high, it is a challenge to from micro holes or trenches with high aspect ratio. Further, the thickness of the barrier layer is positively proportional to the thickness of the photoresist in the lithography process, therefore the TSV process for forming the pattern with high aspect ratio will encounter the problem that the resolution conflicts with the etching depth. The prior arts do not provide any breakthrough for this problem. Furthermore, the lithography process includes complicated steps, and it is inevitable to require much time and labor in the TSV process.

With regard to the process of forming the aluminum nitride interposer, the TSV process is one of the key developing processes. Developing the TSV process for the aluminum nitride substrate interposer mainly lies in the technique of forming the micro holes with high aspect ratio (blind holes or through holes). If the aluminum nitride substrates can be used in the 3D IC process and the metallized through holes with high aspect ratio can be efficiently formed, thermal accumulation produced by the stacked multi-chip module system at high power can be effectively reduced, and the reliability of the system can be enhanced and the signal noises can be decreased. Evidently, it is the critical technique of developing the ceramic interposer.

Therefore, there is a need for the industry to develop a method of forming a pattern with high aspect ratio on the polycrystalline aluminum nitride substrate, which helps to efficiently form the metallized through holes with high aspect ratio in the aluminum nitride substrate, so that the 3D IC aluminum nitride ceramic interposer can be prepared.

SUMMARY OF THE INVENTION

In view of the aforesaid drawbacks of the prior art, it is a main objective of the present invention to provide a method of forming a pattern with high aspect ratio on the polycrystalline aluminum nitride substrate for quickly and efficiently forming the aluminum nitride substrate having vias with high aspect ratio, in order to prepare the 3D IC aluminum nitride interposer material with excellent properties.

In the etching process with requirement of high aspect ratio, dry etching can implement effective anisotropic etching that cannot be performed by wet etching and form excellent etched profile. Thus, dry etching becomes a preferable choice for the hole formation process. Since group III nitride AlN has a bonding energy of 11.5 eV/atom, which is higher when compared to non-nitride group III-V semiconductor materials, the group III nitride having bonds with high strength and high energy band gap exhibits excellent chemically inert ability and acid and base erosion resisting ability. Thus, although the etching rate of the aluminum nitride substrate can be increased by using chlorine-based compounds of high density to form inductively coupled plasma, the etching barrier layer will be consumed too fast (i.e., low etching selectivity). Besides, in the lithography process, if the thickness of the barrier is increased, the thickness of the photoresist film will be increased, resulting in resolution of the lithography being lowed.

Therefore, the present invention provides a method of forming a pattern with high aspect ratio on the polycrystalline aluminum nitride substrate, which includes directly forming a pattern on the barrier layer with an energy beam and plasma etching the aluminum nitride substrate to increase the etched depth and resolution of small-sized pattern. The traditional lithography technology used for the ceramic substrates is time-consuming and complicated. In contrast, the method of the present invention can efficiently form a pattern with high aspect ratio on the aluminum nitride substrate, avoiding complicated patterning of the lithography process, decreasing the thickness of the etching barrier layer, reducing the processing duration and costs.

To achieve the above objects, the present invention provides a method of forming a pattern on the polycrystalline aluminum nitride substrate, comprising the steps of: (A) providing an aluminum nitride substrate and forming a barrier layer on the aluminum nitride substrate; (B) etching the barrier layer with an energy beam to form at least one recess in the barrier layer; (C) plasma etching the substrate to deepen the recess into the aluminum nitride substrate; (D) removing the barrier layer to obtain the aluminum nitride substrate having at least one pattern with high aspect ratio.

In one embodiment of the present invention, the pattern is micro holes or a trenches with an aspect ratio greater than 4.

In one embodiment of the present invention, the dry etching selectivity of the barrier layer to the aluminum nitride substrate is 4.88. The thickness of the barrier layer in step (A) is greater than ¼ of the etched depth. The barrier layer is a metal barrier layer or a polymer barrier layer. The barrier layer can be a chromium metal layer to be used as an etching mask. The aforesaid dry etching selectivity is the ratio of the dry etching rate of the film intended to be removed to the dry etching rate of the underneath substrate. In the method of the present invention, different dry etching selectivities can be obtained based on different etching barrier layers, wherein the dry etching selectivity can be greater than 4.

In one embodiment of the present invention, the energy beam in step (B) is a focused ion beam, a laser or an electron beam. In respect of choice of the energy beam, when a focused ion beam is used to define transfer of the pattern, the diameter of the through holes of the aluminum nitride substrate is usually less than 30 μm which belongs to processing of smaller hole diameter; when a laser is used to define transfer of the pattern, the diameter of the through holes of the aluminum nitride substrate is usually greater than 30 μm which belongs to processing of larger hole diameter. If a focused ion beam is used, a gallium metal ion source is used to perform formation of the barrier layer, wherein the operating voltage of the ion source is in the rage of 5-30 kV and the operating distance is less than 50 mm.

In one embodiment of the present invention, the plasma etching in step (C) can employ inductively coupled plasm. The etching gases include a chlorine gas or a chlorine-based gas. Inductively coupled plasm formed of $Ar/Cl_2$ can be used to etch the aluminum nitride substrate, wherein RF power of the coils and RF power of the lower electrode are in the range of 300-1000 W.

The present invention provides a method of forming a pattern with high aspect ratio on the polycrystalline aluminum nitride substrate, which is characterized in that an energy beam is firstly used to define the etching portions on the barrier layer, and plasma etching is then used to etch the aluminum nitride substrate for efficiently forming transfer of the pattern with high aspect ratio, and the barrier layer is finally removed. The aluminum nitride substrate having micro holes and trenches can achieve the aspect ratio of 4.88, which has satisfied the usable standard of the products.

Both the above summary and the following description and drawings aim to further explain the techniques and means required to achieve the predetermined objectives of the present invention as well as the effects thereof. The other objectives and advantages of the present invention are described in the following description and drawings.

DETAILED DESCRIPTION OF THE PREFERRED EMBODIMENTS

The following will illustrate the embodiments of the present invention by specific examples. Any persons skilled in the art could easily understand the advantages and the effects of the present invention from the disclosed contents in the present specification.

The present invention provides a method of forming a pattern with high aspect ratio on the polycrystalline aluminum nitride substrate. The method is characterized in directly forming a small-sized pattern on the barrier layer with an energy beam, wherein the energy beam defines the portions to be etched and the etching selectivity of the substrate is increased, etching the aluminum nitride substrate by plasma etching to efficiently perform transfer of the pattern with high aspect ratio, and removing the barrier layer after the etching step is completed.

Figure 1:
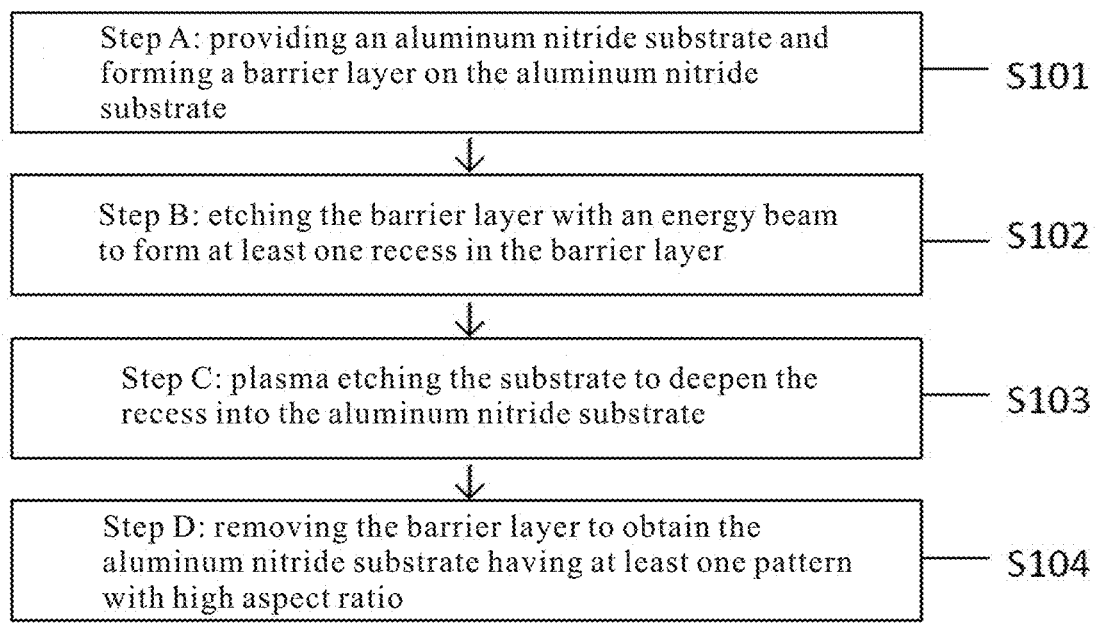
FIG. 1 is a flow chart of a method of forming a pattern with high aspect ratio on the polycrystalline aluminum nitride substrate according to the present invention.

Please refer to FIG. 1 which is a flow chart of a method of forming a pattern with high aspect ratio on the polycrystalline aluminum nitride substrate according to the present invention. As shown, the method of forming a pattern with high aspect ratio on the polycrystalline aluminum nitride substrate includes the steps of: (A) providing an aluminum nitride substrate and forming a barrier layer on the aluminum nitride substrate (S101); (B) etching the barrier layer with an energy beam to form at least one recess in the barrier layer (S102); (C) plasma etching the substrate to deepen the recess into the aluminum nitride substrate (S103); (D) removing the barrier layer to obtain the aluminum nitride substrate having at least one pattern with high aspect ratio (S104).

The plasma etching step (C) can be performed by inductively coupled plasma, and the etching gases include a chlorine gas or a chlorine-based gas. The inductively coupled plasma formed of $Ar/Cl_2$ can be used to etch the aluminum nitride substrate, wherein RF power of the coils and RF power of the lower electrode are in the range of 300-1000 W.

Embodiment 1

Figure 2:
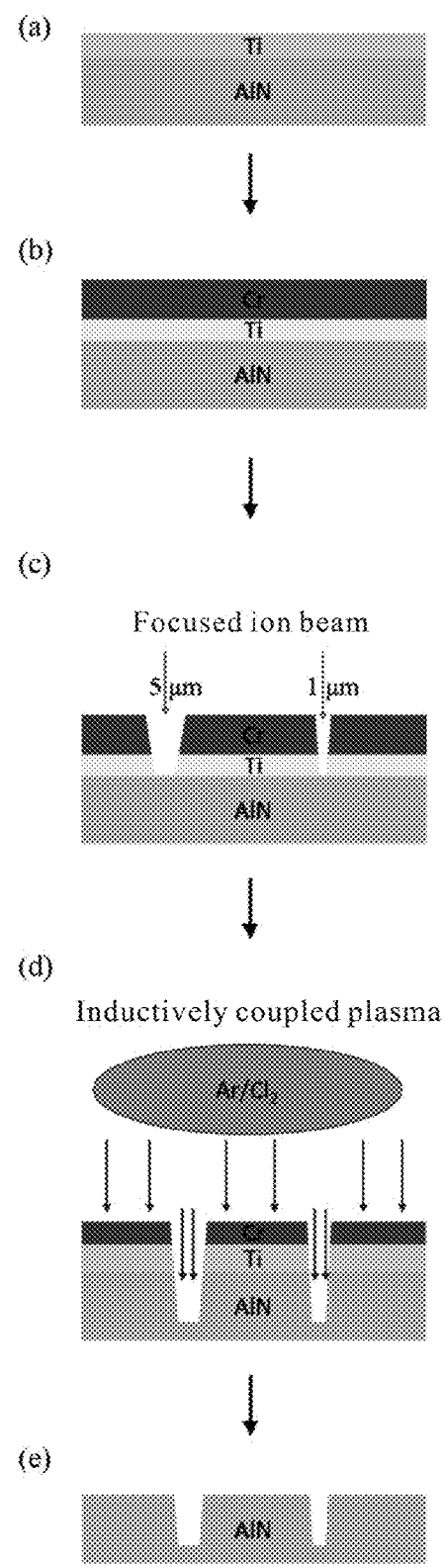
FIG. 2 is a schematic diagram showing the process flow according to Embodiment 1 of the present invention.

Please refer to FIG. 2 which is a schematic diagram showing the process flow according to Embodiment 1 of the present invention. A metal layer of titanium (Ti) is coated on aluminum nitride by sputtering, wherein the metal layer of titanium (Ti) is used as an adhesion enhancing layer between the hard mask and aluminum nitride. Next, chromium metal is coated on the metal layer of titanium as a barrier layer, as shown in FIG. 2(b). Thereafter, the sample is put into the focused ion beam etching system with the chamber being vacuumed and the sampled being positioned. When the degree of vacuum is below $3*10^{-6}$ bar, a gallium ion beam is used to perform formation of patterned holes in the hard mask (Source of the ions further includes In, Au, and $AsPd_2$, etc.). The operating voltage is 10 kV and the operating current is 8 nA for bombarding the hard mask of chromium metal. By bombarding the chromium metal layer and the titanium metal layer, the barrier layer is penetrated, exposing aluminum nitride and forming at least one recess in the barrier layer, as shown in FIG. 2(c). Then, the sample is put on a Si carrier which is further transported into the ICP-RIE etcher. Etching is carried out with $Ar/Cl_2$ being used as reactive gases at the flow rate of 10/160 sccm under the conditions of 15 mbar of chamber pressure, 1200 W of coil power, and 600 W of platen power, etc., and the desired etching depth is achieved. FIG. 2(d) shows the cross-section of the sample after plasma etching. The measured etching rate is 400 nm/min. Finally, the barrier layer is removed to obtain the polycrystalline aluminum nitride substrate having micro holes with high aspect ratio, as shown in FIG. 2(e).

Figure 3:
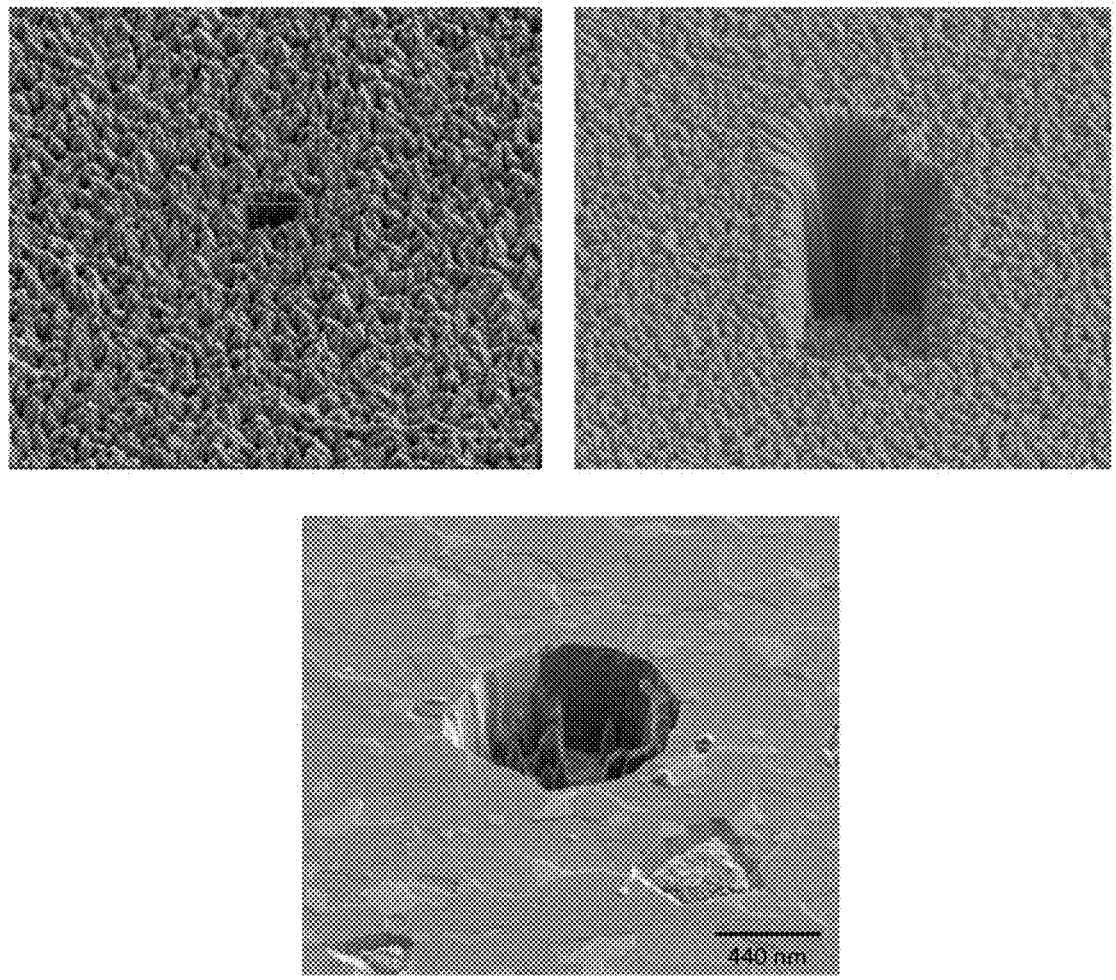
FIG. 3 are scanning electron microscope (SEM) photographs of the sample according to Embodiment 1 of the present invention.

Please refer to FIG. 3 which are scanning electron microscope (SEM) photographs of the sample according to Embodiment 1 of the present invention. As shown, the polycrystalline aluminum nitride substrate having micro holes with high aspect ratio prepared by the above method includes the holes having a hole width of 2.63 μm, a hole depth of 11.92 μm, and an aspect ratio of 4.53.

Embodiment 2

Figure 4:
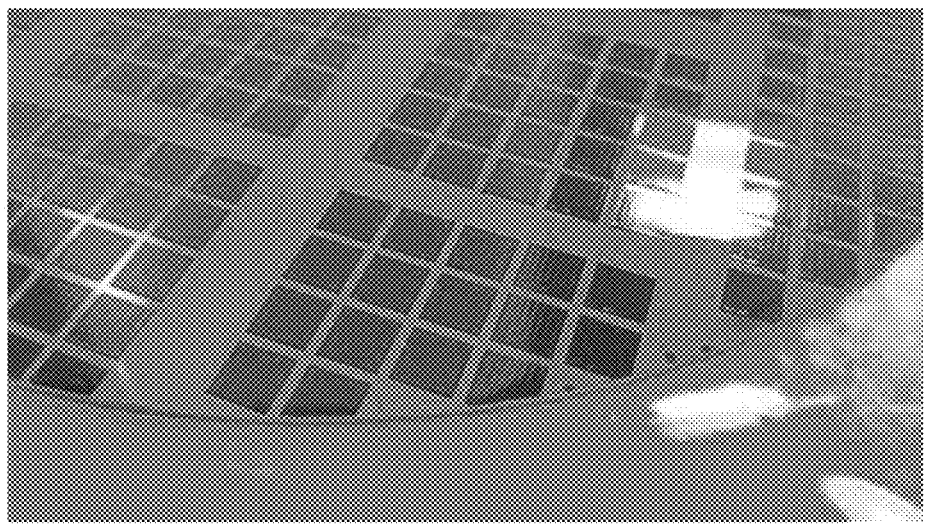
FIG. 4 is a photograph showing pattern transfer according to Embodiment 2 of the present invention.

The method includes treating the surface of the aluminum nitride substrate by a RIE system where $O_2$ is inputted therein, cleaning soil and moisture on the surface, forming a negative type photoresist layer, and performing curing at 110° C. for 30 minutes, wherein the photoresist layer is used as a barrier layer after the curing step. Next, the sample is putted into a focused ion beam etching system. When the degree of vacuum is below $3*10^{-6}$ bar, a gallium ion beam is used to perform formation of patterned holes in the hard mask. The operating voltage is 6 kV and the operating current is 4 nA for bombarding the negative type photoresist layer. By bombarding the barrier layer, the barrier layer is penetrated, exposing aluminum nitride and forming at least one recess in the barrier layer, as shown in FIG. 4 which is a photograph showing pattern transfer according to Embodiment 2 of the present invention. Then, the sample is put on a Si carrier which is further transported into the ICP-RIE etcher. Etching is carried out with $Ar/Cl_2$ being used as reactive gases at the flow rate of 10/160 sccm under the conditions of 30 mtorr of chamber pressure, 600 W of coil power, 1000 W of platen power, and 30° C. of chuck table temperature, etc. The measured etching rate is 391 nm/min. Finally, the barrier layer is removed to obtain the polycrystalline aluminum nitride substrate having micro holes and trenches with high aspect ratio.

Figure 5:
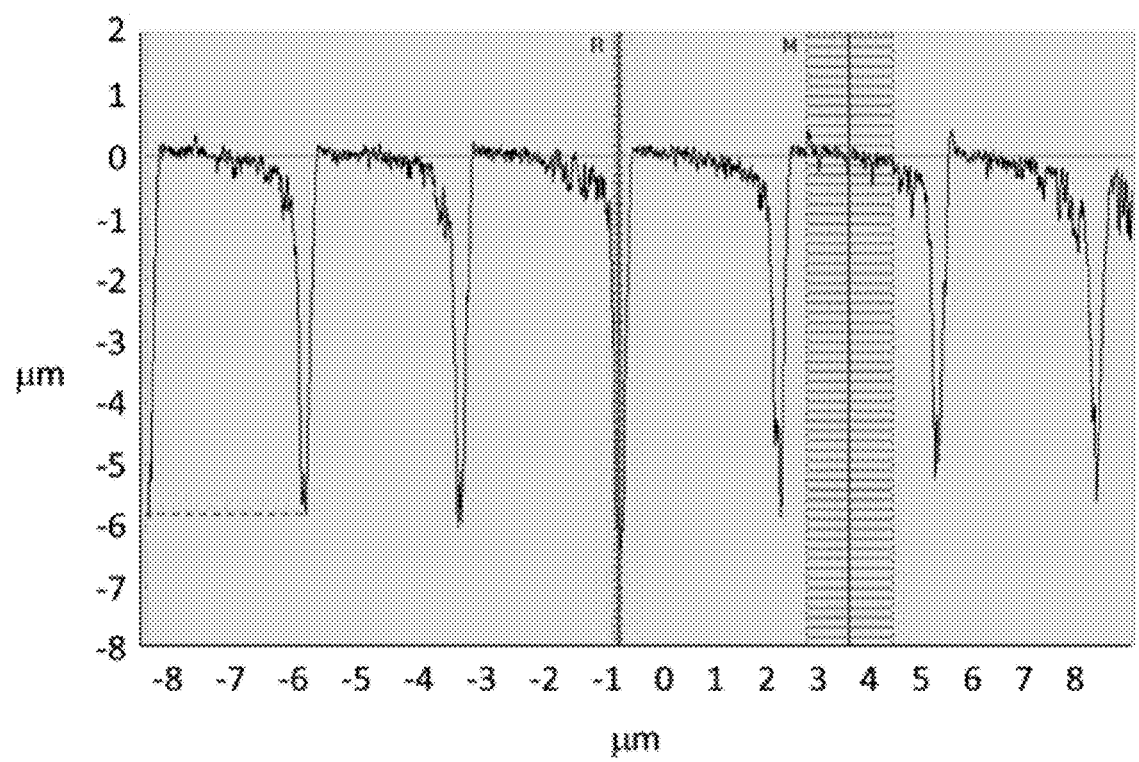
FIG. 5 shows surface morphology of the sample according to Embodiment 2 of the present invention by using an atomic force microscope (AFM)
Figure 6:
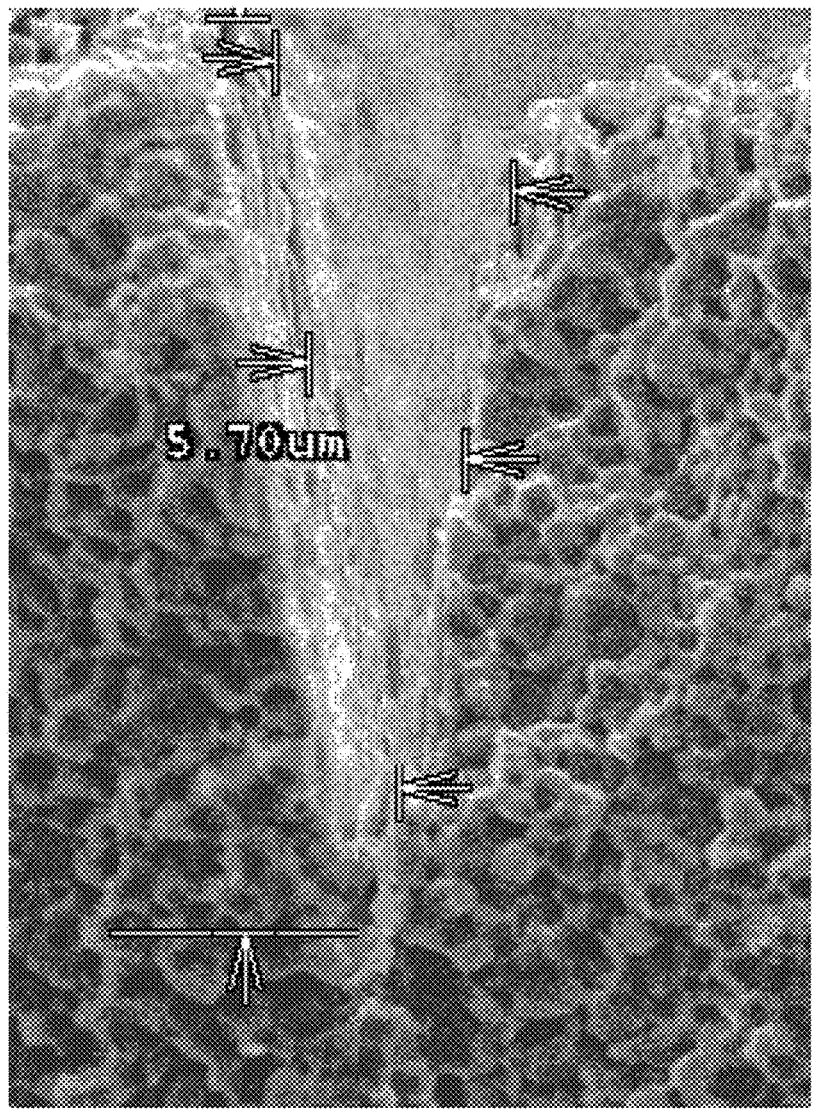
FIG. 6 is a scanning electron microscope (SEM) photograph of the sample according to Embodiment 2 of the present invention.

Please refer to FIG. 5 which shows surface morphology of the sample according to Embodiment 2 of the present invention by using an atomic force microscope (AFM). Please refer to FIG. 6 which is a scanning electron microscope (SEM) photograph of the sample according to Embodiment 2 of the present invention. As shown, the polycrystalline aluminum nitride substrate prepared by the above method has micro holes and trenches with high aspect ratio, wherein the hole width is 1.45 μm, the hole depth is 5.79 μm, and the aspect ratio is 4.01.

The present invention provides a method of directly forming a barrier layer having a small-sized pattern on the polycrystalline aluminum nitride substrate, as well as a method of quickly, efficiently, and selectively forming a pattern with high aspect ratio by plasma etching. Compared to the traditional photolithography technique, the present invention uses the energy beam to define the etching portions and pattern of the aluminum nitride substrate, which replaces the traditional exposure procedure of the hard mask pattering that is more complicated, and employs inductively coupled plasma etching, to prepare the aluminum nitride substrate having a pattern with high aspect ratio. The present invention can be used to enhance thinning of lines to have high aspect ratio or improves precision and speed of preparing aluminum nitride substrate with tiny holes and a small quantity of holes.

The above embodiments are just illustrated to explain the characteristics and the effects of the present invention and are not used to limit the scope of the substantial content of the present invention. Any persons skilled in the art can make modifications and changes to the above embodiments without departing from the spirit and scope of the present invention. Accordingly, the scope intended to be protected by the present invention should be defined by the appended claims.

What is claimed is:

1. A method of forming a pattern with high aspect ratio on a polycrystalline aluminum nitride substrate, comprising the steps of:
    (A) providing an aluminum nitride substrate and forming a barrier layer on the aluminum nitride substrate;
    (B) etching the barrier layer with an energy beam to form at least one recess in the barrier layer;
    (C) plasma etching the substrate to deepen the recess into the aluminum nitride substrate; and
    (D) removing the barrier layer to obtain the aluminum nitride substrate having at least one pattern with high aspect ratio,
        wherein the barrier layer in step (A) is a metal barrier layer or a polymer barrier layer.

2. The method of forming a pattern with high aspect ratio on a polycrystalline aluminum nitride substrate as claimed in claim 1, wherein the pattern is micro holes or trenches.

3. The method of forming a pattern with high aspect ratio on a polycrystalline aluminum nitride substrate as claimed in claim 1, wherein the pattern with high aspect ratio has an aspect ratio greater than 4.

4. The method of forming a pattern with high aspect ratio on a polycrystalline aluminum nitride substrate as claimed in claim 1, wherein the dry etching selectivity of the barrier layer to the aluminum nitride substrate is greater than 4.

5. The method of forming a pattern with high aspect ratio on a polycrystalline aluminum nitride substrate as claimed in claim 1, wherein a thickness of the barrier layer in step (A) is greater than ¼ of the etched depth.

6. The method of forming a pattern with high aspect ratio on a polycrystalline aluminum nitride substrate as claimed in claim 1, wherein the energy beam in step (B) is a focused ion beam, a laser or an electron beam.

7. The method of forming a pattern with high aspect ratio on a polycrystalline aluminum nitride substrate as claimed in claim 1, wherein step (C) employs inductively coupled plasma to perform etching.

8. The method of forming a pattern with high aspect ratio on a polycrystalline aluminum nitride substrate as claimed in claim 1, wherein the etching gases in step (C) include a chlorine gas or a chlorine-based gas.

9. The method of forming a pattern with high aspect ratio on a polycrystalline aluminum nitride substrate as claimed in claim 1, wherein the etching rate in step (C) is 400 nm/min.

10. A method of forming a pattern with high aspect ratio on a polycrystalline aluminum nitride substrate, comprising the steps of:
   (A) providing an aluminum nitride substrate and forming a barrier layer on the aluminum nitride substrate;
   (B) etching the barrier layer with an energy beam to form at least one recess in the barrier layer;
   (C) plasma etching the substrate to deepen the recess into the aluminum nitride substrate; and
   (D) removing the barrier layer to obtain the aluminum nitride substrate having at least one pattern with high aspect ratio,
      wherein the energy beam in step (B) is a focused ion beam, a laser or an electron beam.

\* \* \* \* \*